United States Patent [19]
Fuderer

[11] Patent Number: 5,581,181
[45] Date of Patent: Dec. 3, 1996

[54] GRASE MRI WITH READ GRADIENT POLARITY CORRECTION AND $T_2$ MEASUREMENT

[75] Inventor: Miha Fuderer, Eindhoven, Netherlands

[73] Assignee: U.S. Philips Corporation, New York, N.Y.

[21] Appl. No.: 362,620

[22] Filed: Dec. 22, 1994

[30] Foreign Application Priority Data

Dec. 24, 1993 [EP] European Pat. Off. .............. 93203680

[51] Int. Cl.⁶ .................................................. G01R 33/48
[52] U.S. Cl. ...................................... 324/309; 128/653.2
[58] Field of Search .................................. 324/307, 309, 324/300; 128/653.2, 653.5

[56] References Cited

U.S. PATENT DOCUMENTS

| | | | |
|---|---|---|---|
| 4,740,748 | 5/1988 | Rzedzian | 324/309 |
| 5,055,789 | 10/1991 | Kondo et al. | 324/309 |
| 5,122,747 | 6/1992 | Riederer et al. | 324/309 |
| 5,162,730 | 11/1992 | Schmitt et al. | 324/309 |
| 5,270,654 | 12/1993 | Feinberg et al. | 324/309 |
| 5,304,931 | 5/1994 | Flamig et al. | 324/309 |
| 5,337,000 | 8/1994 | Bruder | 324/309 |

FOREIGN PATENT DOCUMENTS

0529527 3/1993 European Pat. Off. .

*Primary Examiner*—Sandra L. O'Shea
*Assistant Examiner*—Raymond Y. Mah
*Attorney, Agent, or Firm*—Jack D. Slobod

[57] ABSTRACT

In a GRASE magnetic resonance method, most profiles in k-space with a certain $k_y$ value are measured with different magnetic field read gradient polarity and at different time intervals from the excitation RF-pulse. The two resulting sets of measurements, with positive and negative read gradient polarity, respectively, are used to correct read gradient polarity dependent phase errors, in order to obtain reconstructed images in which the effects of these phase errors are greatly reduced. In an improved version the measurements are used to reconstruct images with a predictable $T_2$ weighting.

20 Claims, 4 Drawing Sheets

GRASE MRI WITH READ GRADIENT POLARITY CORRECTION AND $T_2$ MEASUREMENT

BACKGROUND OF THE INVENTION

1. Field of the Invention

The invention relates to a method for magnetic resonance imaging of at least a portion of a body placed in a stationary and substantially homogeneous main magnetic field, the method comprising applying an excitation radio-frequency pulse (RF-pulse) for excitation of nuclear dipole moments in said portion of the body, followed by switching a plurality of magnetic field read gradient pulses having alternate positive and negative polarity for generating a plurality of magnetic resonance signals in the excited portion, and simultaneously measuring signal samples of said magnetic resonance signals and using said acquired signal samples for the reconstruction of an image of said body. The invention also relates to an apparatus for performing such a method.

2. Description of the Related Art

In such a method the acquired signal samples have phase errors which are mainly due to the fact that the positive and negative polarity magnetic field read gradient pulses are subject to more differences than only their polarity. Due to differences in hardware, switching history, eddy current effects in the MRI device, etcetera, the shape and time integrated size of the pulses varies during a measurement sequence. Consequently, phase errors occur in the signals samples which phase errors appear polarity dependent. In the European Patent Application No. 93202678.4, filed 16 September 1993 and forming prior art under Article 54(3) EPC with respect to the European counter part of the application, a method according to the introductory paragraph is described. According to this prior method the phase errors are determined in an area of k-space as a function of the phase-encoding gradient strength. Subsequently, the obtained phase errors are extrapolated over the whole of k-space and taken into account during the image reconstruction procedure. In this way an image is obtained in which the effects of the difference of the alternating polarity of the magnetic field read gradients is largely removed.

In the method according to the introductory paragraph, imaging errors are not only caused by the alternation of the magnetic field read gradient, another cause of imaging errors is the transverse relaxation of the magnetization in the body. Due to this so-called $T_2$-relaxation the signal size for magnetic resonance signals decreases with increasing time from the excitation RF-pulse. The relaxation time constant $T_2$ is different for different types of matter, i.e. different types of tissue in a patient investigated by magnetic resonance imaging. As signals from different regions in k-space are measured at different time intervals from the excitation RF-pulse, a different weight is applied to the many measured signal samples in k-space. In particular if k-space is scanned such that the phase-encoding value is not a monotonic function of the time to the excitation RF-pulse, this will lead to ghost-artefacts.

SUMMARY OF THE INVENTION

It is, inter alia, an object of the invention to provide a method and a device for magnetic resonance imaging according to the introductory paragraph in which not only the different effects of positive and negative polarity magnetic field read gradients are corrected, but in which also the effects of $T_2$-relaxation are significantly reduced.

To this end, a method according to the invention comprises, in addition to the steps mentioned in the introductory paragraph, the steps of applying magnetic field phase-encoding gradient pulses such that said signal samples are located on lines running to and fro in k-space, whereby at least two measurements are performed of substantially all said lines of signal samples, the measurements comprising both polarities of the magnetic field read gradient and at least two substantially-different time intervals from the excitation RF-pulse. The measurements with different magnetic field read gradient polarity provide information about the induced phase errors as a function of the time integrated strength of the magnetic field phase-encoding gradient. The measurements having equal phase-encoding value but different time intervals from the excitation RF-pulse differ in signal strength due to $T_2$-relaxation. The effects of $T_2$-relaxation can then be taken into account during image reconstruction. The novel method is in particular advantageous if the excitation RF-pulse is followed by a plurality of refocusing RF-pulses whereby, following each of the refocusing RF-pulses, the magnetic resonance signals are generated during a series of magnetic field read gradient pulses alternating in polarity.

Preferably, signal samples are acquired such that substantially each of said lines in k-space is sampled two times, once with a positive polarity magnetic field read gradient and a first time interval from the excitation RF-pulse and once with a negative polarity magnetic field read gradient and a second time interval from the excitation RF-pulse, said first and second time intervals being substantially different. As substantially each line is measured only twice, this is the most time efficient way to obtain all data required for the error compensation for image errors from both sources. Preferably, the sum of the first and second time intervals has a smooth behavior as a function of the net phase-encoding gradient value ($k_y$-value).

In an embodiment of the method according to the invention two sub-images are being formed from the acquired signal samples with positive and with negative polarity read gradients, respectively, that each of the sub-images is corrected for phase-errors and that the corrected sub-images are added. From the signals acquired with a single polarity of the magnetic field read gradient the phase error can be obtained and the signals can be corrected. By the subsequent addition of the phase corrected images the contributions for different time intervals from the excitation RF-pulse are combined. Consequently, in the resulting added or, after division by two, averaged image the effects of the $T_2$-relaxation are largely reduced.

In an embodiment of the invention the difference in time between two measurements of the same line is small as compared to the transverse relaxation time $T_2$ occurring in the portion of the body to be imaged and wherein for each point in the image a value is determined which relates to the transverse relaxation time $T_2$. As will be shown hereinafter, if said difference is non-zero it is to possible to reconstruct an image that would have been obtained with a predetermined, desired, echo time. A good quality image is obtained with a reasonable amount of calculation performed on the measured data if the actual measurement time from the excitation RF-pulse and said predetermined echo time is of the same order or smaller then the typical values of $T_2$ occurring in the object. Under these conditions, it becomes feasible to construct images with $T_2$ enhanced contrast without a very lengthy measuring procedure. The requirement that the difference in time between the two actual echo times and the desired echo time must be small as compared to $T_2$ can be met in practise. $T_2$ in biological samples varies between about 40 and 90 ms. A complete measurement sequence takes about 100 ms, so that an interval between the extremes and the desired echo time can be chosen as being close to $T_2$ or smaller. If this requirement is not obeyed an image with predetermined $T_2$ weighting is still possible with the present method but at the expense of significantly more complicated calculations.

In the method according to the present invention, k-space has to be scanned twice to be able to reduce imaging errors due to read gradient polarity and $T_2$ relaxation. The doubling in data acquisition time can be made good by measuring substantially only one half of k-space. The one half of k-space not measured can be estimated from the measured data by the a priori knowledge that phase corrected data should be hermitical. Such a procedure per se is described by P. Margosian, Book of Abstracts, page 1024, 4th meeting of the SMRM, London, 1985, and in EP-A 0 250 050.

The invention also relates to an apparatus for magnetic resonance imaging, arranged to operate in accordance with a method as described hereinbefore. According to the invention, such an apparatus comprising means for establishing the main magnetic field, means for generating gradient magnetic fields superimposed upon the main magnetic field, means for radiating RF-pulses towards the body, control means for steering the generation of the gradient magnetic fields and the RF-pulses, means for receiving and sampling magnetic resonance signals generated by sequences of RF-pulses and switched gradient magnetic fields, and reconstruction means for forming an image from said signal samples, said control means being arranged for applying an excitation radio-frequency pulse (RF-pulse) for excitation of nuclear dipole moments in said portion of the body, followed by switching a plurality of magnetic field read gradient pulses having alternate positive and negative polarity, for generating a plurality of magnetic resonance signals in the excited portion, and simultaneously measuring signal samples of said magnetic resonance signals, the control means being further arranged for applying magnetic field phase-encoding gradient pulses such that said signal samples are located on lines running to and fro in k-space, whereby for substantially all said lines signal samples are acquired with both polarities of the magnetic field read gradient and with a substantially different time interval from the excitation RF-pulse These and other, more detailed, aspects of the invention will now be elucidated by way of example with reference to the accompanying drawings.

DETAILED DESCRIPTION OF THE PREFERRED EMBODIMENT

Figure 1:
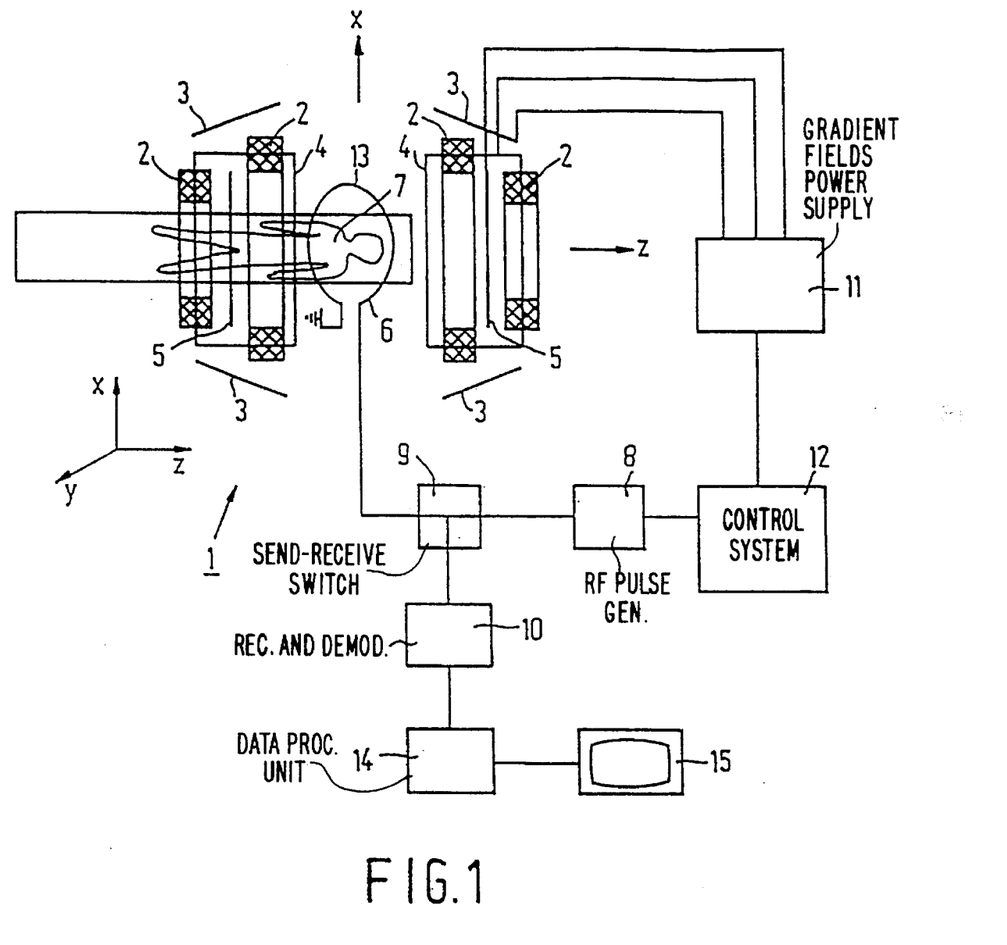
FIG. 1, diagrammatically a magnetic resonance imaging apparatus, suitable for the method according to the invention.

In FIG. 1 a magnetic resonance apparatus 1 is diagrammatically shown. The apparatus comprises a set of main magnetic coils 2 for generating a stationary and homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energized via a power supply 11. The apparatus further comprises radiation emitting means 6, an antenna or coil, for emitting radio-frequency pulses (RF-pulses) to an object or body 7, the radiation means being coupled to a RF-pulse generator 8 for generating and modulating the RF-pulses. Also provided are means for receiving the NMR-signals, these means can be identical to the emitting means 6 or be separate. If the emitting and receiving means are identical, as shown in FIG. 1, a send-receive switch 9 is arranged to separate the received signals from the pulses to be emitted. The received NMR-signals are input to a receiver and demodulator 10. The emitting means 6 and 8 and the power supply 11 for the gradient coils 3, 4 and 5 are steered by a control system 12 to generate a predetermined sequence of RF-pulses and gradient field pulses. The receiver and demodulator is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments or nuclear spins in the body will be aligned in the direction of the magnetic field. In equilibrium, this causes a net magnetization $M_0$ in the material of the body 7, directed in parallel with the magnetic field. This macroscopic magnetisation $M_0$ is then manipulated by irradiating the body with E-pulses having a frequency equal to the Larmor frequency of the nuclei, thereby bringing the nuclear dipole moments in an excited state and re-orienting the magnetization $M_0$. By applying the proper RF-pulses, a rotation of the macroscopic magnetization is obtained, the angle of rotation is called the flip-angle. The intentional introduction of variations in the magnetic field by applying gradient magnetic fields influences the resonance frequency and the magnetization locally. After application of a well chosen sequence of RF-pulses and magnetic field gradient pulses NMR-signals are emitted from the body which signals provide information about the density of a certain type of nuclei, for example hydrogen nuclei, and the substance in which they occur. By analysis of the emitted signals and presentation of it in the form of images, information about the internal structure of the object or body 7 is accessible. For a more detailed descriptions of magnetic resonance imaging (MRI) and MRI-devices reference is made to the extensive literature on this subject, for example to the book "Practical NMR Imaging", edited by M. A. Foster and J. M. S. Hutchison, 1987, IRL Press.

Figure 2:
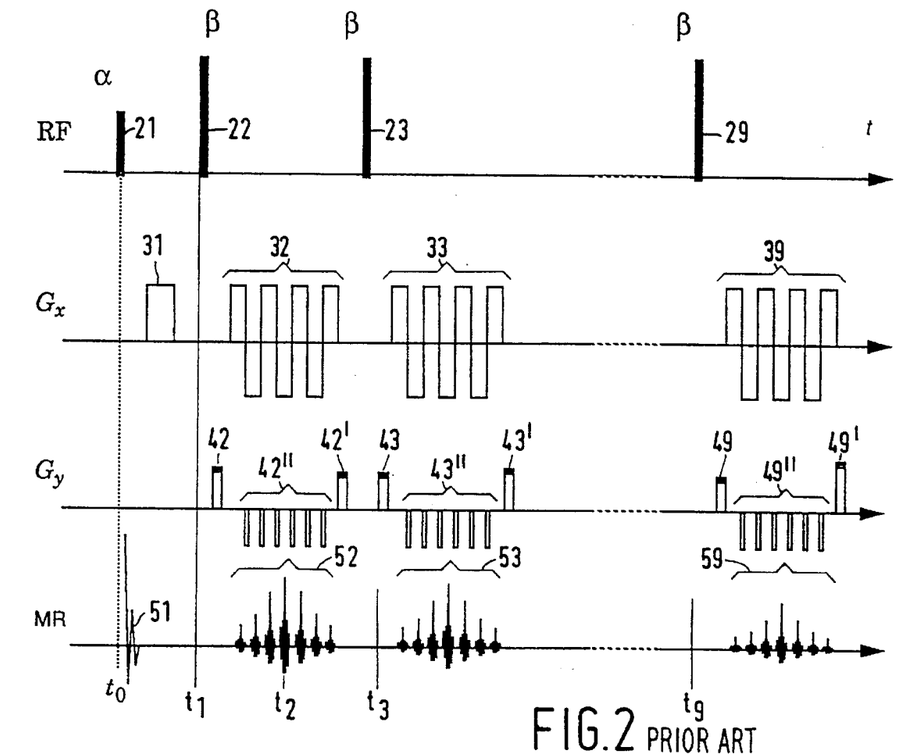
FIG. 2, a sequence of an excitation RF-pulse, a plurality of refocusing RF-pulses and reversal gradient pulses for use in a method according to prior art.

FIG. 2 shows a known sequence of RF-pulses and magnetic field gradients according to the so-called GRASE method, described by D. A. Feinberg and K. Oshio in the article "GRASE (Gradient and Spin-Echo) MR imaging: A new fast clinical imaging technique", in Radiology, Vol 181 (1991), pages 597–602. The FIG. 2 shows four rows, labelled RF, indicating the occurrence of RF-pulses as a function of time, $G_x$ and $G_y$, indicating the occurrence of magnetic gradient fields in the x- and y-directions, respectively, and MR, indicating the occurrence of the magnetic resonance signals in the body caused by the RF and gradient pulses.

At time $t_0$ an excitation RF-pulse 21 is applied with a flip-angle $\alpha$, followed at time $t_1$ by a first refocusing RF-pulse 22 with a flip-angle $\beta$. The values of $\alpha$ and $\beta$ are usually chosen to be 90° and 180°, respectively. Sequences with flip-angles deviating from these values are, however, possible. Following the excitation RF-pulse 21, a free induction decay (FID) nuclear magnetic resonance signal 51, indicated in the row MR, is generated which vanishes rapidly when the individual precessing nuclear magnetic dipole moments loose phase coherence (dephase) due to local variations in the magnetic field. The refocusing RF-pulse 22 reverses the direction of these individual magnetic dipole moments without affecting the local magnetic field. Consequently, dephasing is reversed into a rephasing which, in the absence of magnetic field gradients, would result at a time $t_2$, being equal to $2t_1$, in an NMR spin-echo signal. However, as indicated in the row $G_x$, prior to the refocusing RF-pulse 22 a magnetic field 31 with a gradient in the x-direction is applied that also causes dephasing of the nuclear spins. After reversal of the spins by the refocusing RF-pulse 22 a train 32 of magnetic field read gradients with alternating polarity, is applied. This causes compensation of the dephasing of the spins, resulting in the occurrence of a so-called field or gradient echo and subsequently renewed dephasing. Hereinafter, each section of this train between reversals is termed a lobe of the read gradient. Each subsequent lobe causes the generation of a further echo signal, resulting in a series 52 of magnetic resonance echo signals. The sequence can be repeated a number of times by repetition of refocusing RF-pulses 23, . . . , 29 with flip-angles $\beta$ at times $t_3, \ldots, t_9$ and subsequent trains 33, . . . , 39 of read gradient pulses with alternating polarity resulting in series of echo signals 53, . . . , 59. The times $t_3, \ldots, t_9$ are normally chosen such that $t_3=3t_1$ and that the intervals in between the refocusing RF-pulses are of equal length $2t_1$.

Also following the refocusing RF-pulses 22, . . . , 29 phase-encoding gradient field pulses are applied with the gradient in the y-direction, as indicated in the row $G_y$. These gradients are applied in pairs 42-42', . . . , 49-49', the second pulse in a pair removing the phase-encoding. At the moments of reversal of the read gradient fields additional blips 42", . . . , 49" in the $G_y$-gradient are applied, modifying the phase-encoding values of the echo signals. Normally, all these blips will be chosen to be equal in length and strength. As a result of the applied gradient magnetic fields, the measured samples of the magnetic resonance (echo) signals are distributed over the whole of k-space on parallel lines running in the $k_x$-direction.

Figure 3:
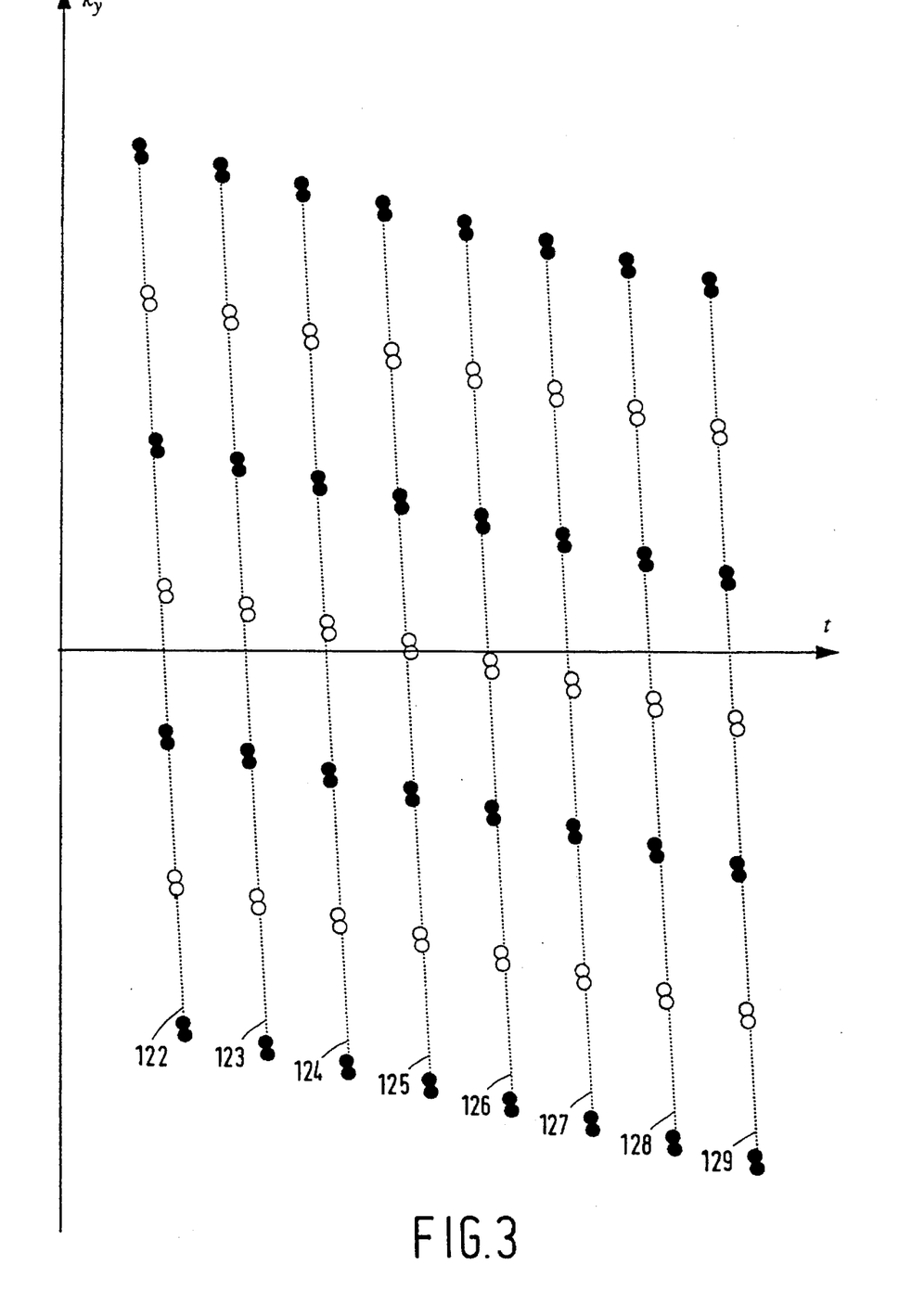
FIG. 3, the phase-encoding value $k_y$ of the acquired signals samples as a function of the time interval t since the excitation RF-pulse for the prior art sequence shown in FIG. 2.

In FIG. 3, the distribution of the signal sample measurements is indicated in the $k_y$-t plane. $k_y$ is proportional to the time-integrated strength of the phase-encoding magnetic field gradient and t is the time interval between the excitation RF-pulse and the moment the respective profile or line in k-space is measured. Shown are points in two measurement sequences as discussed in relation to FIG. 2. The two measurement sequences indicated can be considered as a two-excitation measurement or as the first and last sequences of a multi-excitation measurement. In the Figure each line or profile is indicated by a dot, filled dots are used for a positive polarity read gradient and open dots for a negative polarity read gradient. In between two refocusing RF-pulses 22, 23 the different profiles are located in $k_y$-t plane on a line 122 inclined with respect to the $k_y$-axis. After each refocusing RF-pulse 23, . . . , 29 a new set of profiles is measured located in a lines 123, . . . , 129, respectively, in parallel to the first one. As can easily be seen from FIG. 3, some ranges in $k_y$ are measured with only a positive polarity magnetic field read gradient and some ranges with only a negative polarity read gradient. So, phase errors which differ for the two different read gradient polarities lead to considerable image errors when the data are combined during reconstruction of an image. Furthermore, due to $T_2$-relaxation, signals acquired with a relatively high t-value are smaller than signals with low t. The rate of decay, however, depends on the type of tissue, such that some frequency components may decay faster than others. This effect also leads to imaging errors.

Figure 4:
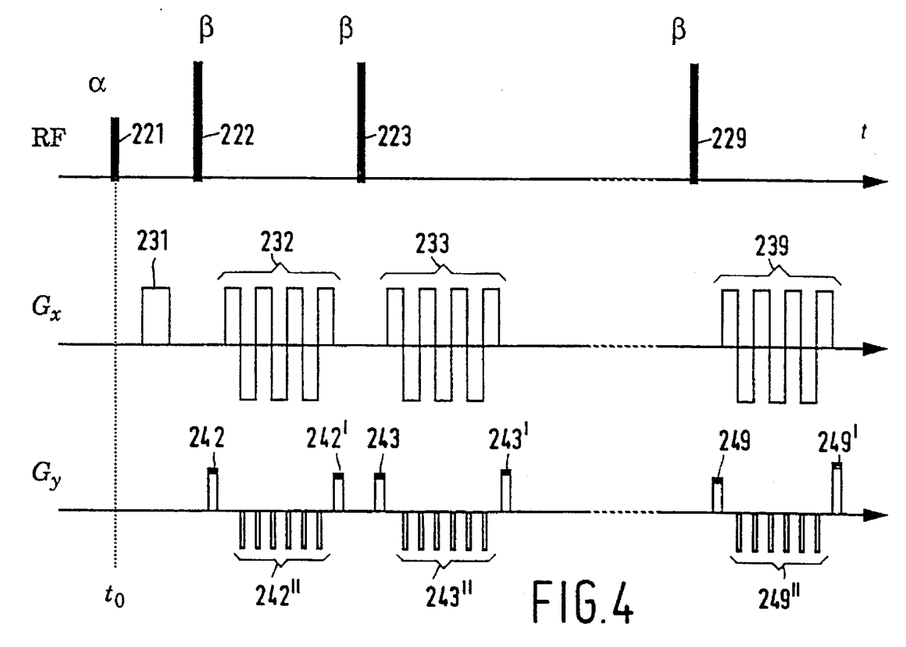
FIG. 4, a data acquisition sequence as shown in FIG. 2 as used for the method according to the invention; and in FIG. 5, the relation between $k_y$ and t for the data acquisition sequence shown in 4.

With reference to FIG. 4 an MRI sequence in accordance with the invention is illustrated. The sequence shown closely resembles the sequence of FIG. 2. It comprises an excitation RF-pulse 221 and several refocusing RF-pulses 222, . . . , 229. In line $G_x$ the behavior of the magnetic field read gradient is represented. A first preparation pulse 231 is applied in between the excitation and first refocusing RF-pulses. As in FIG. 2, trains 232, . . . , 239 of magnetic field read gradients are applied following the refocusing RF-pulses 222, . . . , 229, each train consisting of lobes of equal length and strength and of alternating polarity. In the embodiment shown the first lobe of each train is positive. Line $G_y$ represents the phase-encoding gradient, in between each pair of refocusing RF-pulses a first phase-encoding magnetic field gradient 242, . . . , 249 is applied, followed by a series of, normally equal, blips 242", . . . , 249" and a last gradient 242', . . . , 249'. As in the sequence shown in FIG. 2, the total time-integrated value of the phase-encoding gradient magnetic field in between two refocusing RF-pulses is substantially zero, causing the elimination of phase-encoding at the occurrence of the refocusing RF-pulses. Following the last refocusing RF-pulse in a sequence, elimination of the remaining phase-encoding is normally not necessary. The magnetic resonance signals generated by this sequence is not shown in FIG. 4.

The sequence illustrated in FIG. 4 differs from the sequence in FIG. 2 in the way in which the phase-encoding gradient magnetic field is applied. In FIG. 4 the first phase-encoding gradient 242 following the first refocusing RF-pulse 222 has a relatively high time-integrated strength, the first phase-encoding gradients 243, . . . , 249 which follow the later refocusing RF-pulses 223, . . . , 229 are successively smaller with an amount being equal to twice the time-integrated strength of a single blip divided by the number of refocusing RF-pulses. The difference between successive first phase-encoding gradients 242, . . . , 249 is twice as large as the one used in the sequence of FIG. 2. So, in order to obtain the required density of lines or profiles in k-space, also the number of excitations must be doubled. From one excitation to the next, the time-integrated strength of the phase-encoding gradients 242, . . . , 249 has also to be decreased in a linear manner by an amount equal to twice the time-integrated strength divided by the product of the number of refocusing RF-pulses and the number of excitations. Arrangements other than the illustrated one are possible provided that most lines in k-space are measured at least twice with opposite polarity magnetic field read gradients and with different time intervals t.

Figure 5:
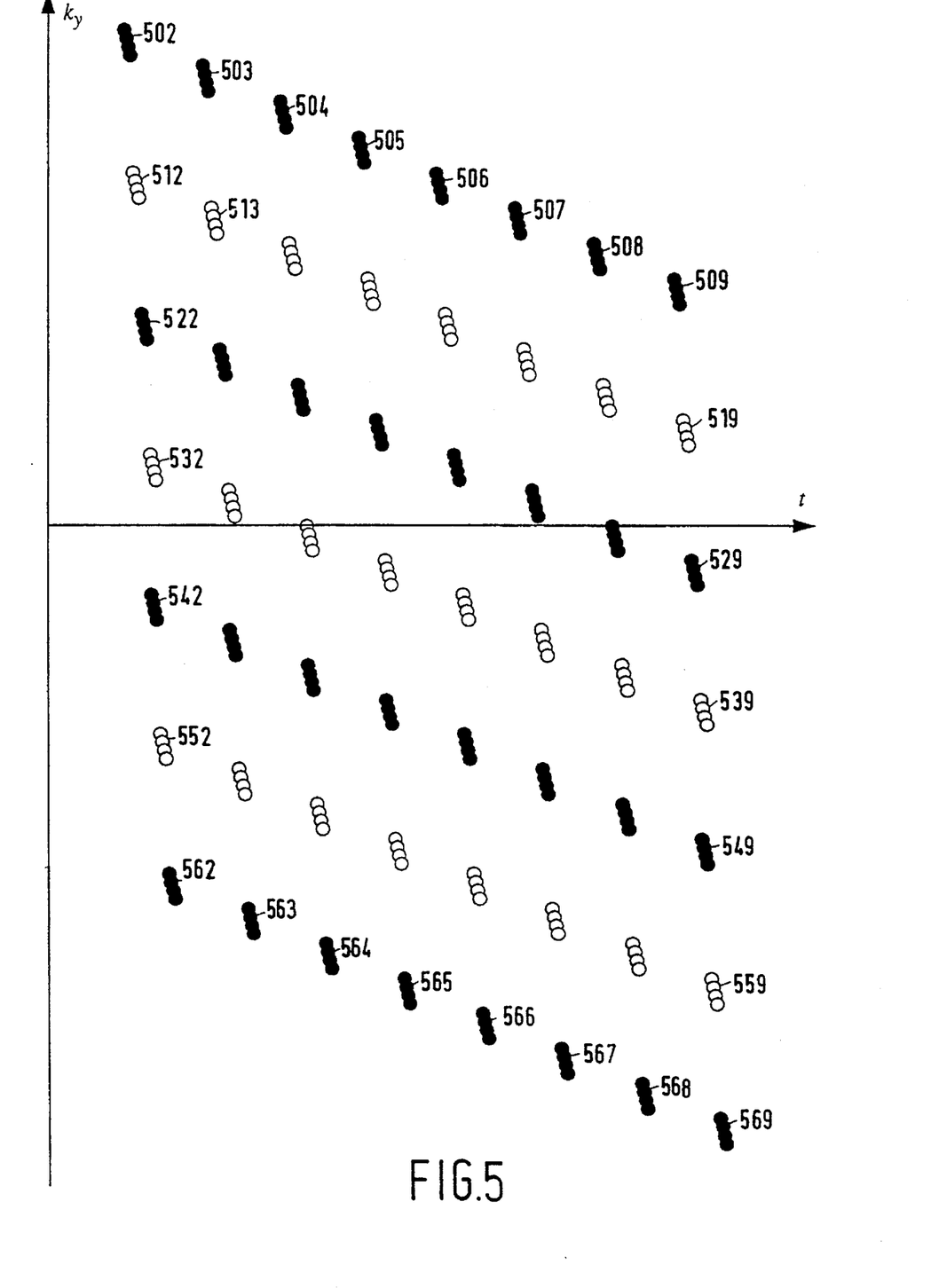

In FIG. 5, the location in the $k_y$-t plane of signal samples acquired according to the novel method is shown. As in FIG. 3, measurements with a positive polarity read gradient are indicated by closed circles, those with a negative polarity read gradient by open circles. The measurements performed after different excitations are located in clusters 502, ..., 509, 512, ..., 519, ..., 562, ..., 569 in the $k_y$-t plane. For almost each cluster 512, 513, ..., another cluster 506, 507, ... with the same $k_y$-range is present but around a different value of t. The exceptions are the clusters 502, ..., 505,566, ..., 569 with extreme $k_y$-values for which no negative read gradient polarity measurement is made.

As both set of measurements, $S_+(k_x,k_y)$ with positive and $S_-(k_x,k_y)$ with negative read gradient polarity, cover substantially the whole range in $k_y$, sub-images $I_+(x,y)$ and $I_-(x,y)$ can be constructed by a two-dimensional Fourier transformation for positive and negative polarity read gradient measurements, respectively. For each of the two images a phase correction can be performed separately. Such phase correction can be based upon the requirement that the magnetic resonance signal should be real halfway between two refocusing RF-pulses, i.e. at the line $k_x=0$ in k-space. Accordingly, the phases of measured profiles at $k_x=0$ in a limited range of $k_y$ close to zero are used to correct the phase of all measurements with the same read gradient polarity. In somewhat more detail, this procedure is described in European Application No. 93202678.4, mentioned hereinbefore, which application is included by reference. As each of the sub-images $I_+(x,y)$ and $I_-(x,y)$ and also the phase corrected sub-images $J_+(x,y)$ and $J_-(x,y)$ is composed from measurements with largely different values of t, ghost artefacts are present in the sub-images due to the different values of the transverse relaxation time constant $T_2$ in different parts of the object. A reduction of these $T_2$-ghosts can be obtained by combining the two sub-images to a single image being the average of the two sub-images: $I(x,y)=\frac{1}{2}\cdot\{J_+(x,y)+J_-(x,y)\}$. In this simple procedure the best results are obtained if the sum $t_1+t_2$ of the values of the intervals $t_1$ and $t_2$ between the excitation RF-pulse and the measurements is constant or smooth as a function of $k_y$. In this respect the sum $t_1+t_2$ is considered smooth if its behavior follows substantially a first, second or third order polynomial.

In the measurement sequence, two complete sets of measurements are obtained. From these two sets, it is possible to determine not only a density distribution from the acquired data, but also to reconstruct an improved image with a $T_2$-weighted contrast as if data acquisition had occurred at a fixed echo time $t_E$. The same information can also be used to determine the value of the transverse relaxation constant as a function of the position in the image, resulting in a dataset $T_2(x,y)$. The formation of such images is described by M. H. Kuhn et al. in the article "Interactive MR image synthesis", in Philips Technical Review, Vol. 43, No. 4, 95–103 (1987).

The image to be obtained can be described by:

$$I_{t_E}(x,y) = M(x,y)\exp\left(-\frac{t_E}{T_2(x,y)}\right),$$

in which M is the magnetisation, which depends on parameters as the local nuclear spin density, the longitudinal relaxation time constant $T_1$ and parameters of the measurement sequence used. As stated hereinbefore, the sets of measurements $S_+(k_x,k_y)$ and $S_-(k_x,k_y)$ for positive and negative polarity magnetic field read gradient, respectively, can be converted to two uncorrected sub-images $I_+(x,y)$ and $I_-(x,y)$, respectively, by means of a two-dimensional Fourier transformation. From the central parts of the sets of measurements $S_+(k_x,k_y)$ and $S_-(k_x,k_y)$ a pair of "central" sub-images $I_{c+}(x,y)$ and $I_{c-}(x,y)$ can be obtained, also by means of a Fourier transformation. The central parts are those measurements that are taken with low $|k_y|$ values. These "central" images are used to perform the phase correction:

$$J_\pm(x,y) = I_\pm(x,y)\exp\{i\phi_\pm(x,y)\} = I_\pm(x,y)\frac{I^*_{c\pm}(x,y)}{|I_{c\pm}(x,y)|},$$

in which the index "c" denotes the "central" images, "±" the images from measurements acquired with a positive and a negative read gradient, respectively, and "*" the complex conjugated value. $J_\pm(x,y)$ represents the phase corrected sub-images.

To obtain an image at a given $t_E$ it is first necessary to determine the relation between the reconstructed "raw" sub-images $I_+(x,y)$ and $I_-(x,y)$ and the desired image $I_{t_E}$. This relation is given by:

$$I_\pm(x,y) = I_{t_E}(x,y)\exp\{i\phi_\pm(x,y)\} - \left(\frac{I_{t_E}(x,y)\exp\{i\phi_\pm(x,y)\}}{T_2(x,y)}\right) \otimes \mathcal{F}_y^{-1}\{t'_\pm(k_y)\}.$$

The time parameters $t'_\pm(k_y)$ are defined as $t'_\pm(k_y)=t_\pm(k_y)-t_E$, i.e. the difference in time between the acquisition of data at position $k_y$ and the desired "echo time" $t_E$. The convolution with the inverse Fourier transform in the y direction, indicated by $\mathcal{F}_y^{-1}$, takes account of the fact that measurements are taken with different $t_\pm'(k_y)$ values. The factor $\exp\{i\phi_\pm(x,y)\}$ describes the phase errors. The given expression is a first order expansion of the exponential $T_2$ dependence, which is a sufficient approximation if all $t'_\pm(k_y)$ are small as compared to the relevant $T_2$ values in the object to be imaged. In the situation that the artifacts due to $T_2$ relaxation give rise to an intensity variation that is small as compared to the intensity of the image, the phase errors in the measured images $I_\pm(x,y)$, which are determined from the "central" images, can be considered to be a sufficient approximation of the phase errors $\phi_\pm(x,y)$. This leads to:

$$J_\pm(x,y) = \frac{I^*_{c\pm}(x,y)}{|I_{c\pm}(x,y)|} I_\pm(x,y) \approx \exp\{-i\phi_\pm(x,y)\}I_\pm(x,y) =$$

$$I_{t_E}(x,y) + \exp\{-i\phi_\pm(x,y)\}\left(\frac{I_{t_E}(x,y)}{T_2(x,y)}\exp\{i\phi_\pm(x,y)\}\right) \otimes \mathcal{F}_y^{-1}\{t_\pm(k_y)\}.$$

If it can be assumed, which in practice is acceptable, that there is no significant difference in the phases between an imaged object and its ghosts, the phase behavior can be taken out of the convolution integral. In that case the relations become:

$$J_\pm(x,y) \approx I_{t_E}(x,y) - \left(\frac{I_{t_E}(x,y)}{T_2(x,y)}\right) \otimes \mathcal{F}_y^{-1}\{t_\pm(k_y)\}.$$

A deconvolution of the difference of the phase corrected sub-images constructed from the measurements with positive and negative read gradient polarity gives:

$$2\frac{I_{t_E}(x,y)}{T_2(x,y)} \approx \mathcal{F}_y\left\{\frac{1}{t'_\Delta(k_y)}\mathcal{F}_y^{-1}\{J_+(x,y) - J_-(x,y)\}\right\},$$

with $$t'_\Delta(k_y) = \frac{t'_+(k_y) - t'_-(k_y)}{2}.$$

In this relation, use is made of the fact that the two measurements at the same $k_y$ value have different t values, i.e. that $t'_A(k_y)$ is unequal to zero. From $$\frac{I_{t_E}(x,y)}{T_2(x,y)}$$

and the sum $J_+(x,y)+J_-(x,y)$ an improved version of the desired image can be obtained:

$$I_{t_E}(x,y) \approx J_+(x,y) + J_-(x,y) + 2\left(\frac{I_{t_E}(x,y)}{T_2(x,y)}\right) \otimes \mathscr{F}_y^{-1}\{t'_m(k_y)\}$$

in which $$t'_m(k_y) = \frac{t'_+(k_y) + t'_-(k_y)}{2}.$$

In comparison to the earlier version, the image is improved in that the $T_2$ weighting is predictable and ghosts due to non-smooth $t'_m(k_y)$ behavior are reduced. $T_2(x,y)$ itself can now easily be obtained from $$\frac{I_{t_E}(x,y)}{T_2(x,y)}$$

and $I_{t_E}(x,y)$.

I claim:

1. Method for magnetic resonance imaging of at least a portion of a body placed in a stationary and substantially homogeneous main magnetic field, the method comprising
applying an excitation RF-pulse for excitation of nuclear dipole moments in said portion of the body, followed by
switching a magnetic field read gradient to form a plurality of lobes of alternate positive and negative polarity, for generating magnetic resonance signals in the excited portion during the respective lobes, and simultaneously measuring signal samples of said magnetic resonance signals, and
further applying magnetic field phase-encoding gradient pulses such that said each magnetic resonance signal is formed with a respective constant phase encoding value, and for substantially all phase encoding values at least two magnetic resonance signals are formed and measured during lobes of both polarities of the magnetic field read gradient and at at least two substantially different time intervals from the excitation RF-pulse,
said acquired samples being used for the reconstruction of an image of said body.

2. Method according to claim 1, wherein substantially each of said magnetic resonance signals is formed and measured two times, once during a positive polarity magnetic field read gradient lobe and a first time interval from the excitation RF-pulse and once during a negative polarity magnetic field read gradient lobe and a second time interval from the excitation RF-pulse, said first and second time intervals being substantially different.

3. Method according to claim 1, wherein two sub-images are derived from the measured magnetic resonance signals formed during positive and formed during negative polarity read gradient lobes, respectively, each of the sub-images being corrected for phase-errors and that the corrected sub-images being added.

4. Method according to claim 1, wherein a difference in time between two measurements of the magnetic resonance signals formed with the same phase encoding value is small as compared to the transverse relaxation time $T_2$ occurring in the portion of the body to be imaged and wherein for each point in the image a value is determined which relates to the transverse relaxation time $T_2$.

5. Method according to claim 1, wherein an image is calculated corresponding to a predetermined value of echo time.

6. Method according to claim 1, wherein said magnetic resonance signals are acquired from substantially one half of k-space.

7. Apparatus for magnetic resonance imaging of a body placed in a stationary and substantially homogeneous main magnetic field comprising means for establishing the main magnetic field, means for generating gradient magnetic fields superimposed upon the main magnetic field, means for radiating RF-pulses towards the body, control means for steering the generation of the gradient magnetic fields and the RF-pulses, means for receiving and sampling magnetic resonance signals generated by sequences of RF-pulses and switched gradient magnetic fields, and reconstruction means for forming an image from said signal samples, said control means being configured for applying an excitation RF-pulse for excitation of nuclear dipole moments in said portion of the body, followed by switching a magnetic field read gradient to form a plurality of lobes of alternate positive and negative polarity, for generating magnetic resonance signals in the excited portion during the respective lobes, and simultaneously measuring signal samples of said magnetic resonance signals, the control means being further configured for applying magnetic field phase-encoding gradient pulses such that said each magnetic resonance signal is formed with a respective phase encoding value, and for substantially all phase encoding values magnetic resonance signals are formed and measured during both polarities of the magnetic field read gradient and at substantially different time intervals from the excitation RF-pulse.

8. Method according to claim 2, wherein two sub-images are derived from the measured magnetic resonance signals formed during positive and formed during negative polarity read gradient lobes, respectively, each of the sub-images being corrected for phase-errors and that the corrected sub-images being added.

9. Method according to claim 2, wherein a difference in time between two measurements of the magnetic resonance signals formed with the same phase encoding value is small as compared to the transverse relaxation time $T_2$ occurring in the portion of the body to be imaged and wherein for each point in the image a value is determined which relates to the transverse relaxation time $T_2$.

10. Method according to claim 3, wherein a difference in time between two measurements of the magnetic resonance signals formed with the same phase encoding value is small as compared to the transverse relaxation time $T_2$ occurring in the portion of the body to be imaged and wherein for each point in the image a value is determined which relates to the transverse relaxation time $T_2$.

11. Method according to claim 8, wherein a difference in time between two measurements of the magnetic resonance signals formed with the same phase encoding value is small as compared to the transverse relaxation time $T_2$ occurring in the portion of the body to be imaged and wherein for each point in the image a value is determined which relates to the transverse relaxation time $T_2$.

12. Method according to claim 2, wherein an image is calculated corresponding to a predetermined value of echo time.

13. Method according to claim 3, wherein an image is calculated corresponding to a predetermined value of echo time.

14. Method according to claim 4, wherein an image is calculated corresponding to a predetermined value of echo time.

15. Method according to claim 8, wherein an image is calculated corresponding to a predetermined value of echo time.

16. Method according to claim 9, wherein an image is calculated corresponding to a predetermined value of echo time.

17. Method according to claim 11, wherein an image is calculated corresponding to a predetermined value of echo time.

18. Method according to claim 2, wherein said magnetic resonance signals are acquired from substantially one half of k-space.

19. Method according to claim 3, wherein said magnetic resonance signals are acquired from substantially one half of k-space.

20. Method according to claim 17, wherein said magnetic resonance signals are acquired from substantially one half of k-space.

* * * * *